(12) United States Patent
Hamada et al.

(10) Patent No.: US 7,228,786 B2
(45) Date of Patent: Jun. 12, 2007

(54) ENGINE PISTON-PIN SLIDING STRUCTURE

(75) Inventors: Takahiro Hamada, Yokohama (JP); Yutaka Mabuchi, Yokohama (JP); Makoto Kano, Yokohama (JP); Hidenori Miyake, Kanagawa (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 0 days.

(21) Appl. No.: 10/844,395

(22) Filed: May 13, 2004

(65) Prior Publication Data

US 2004/0261614 A1 Dec. 30, 2004

(30) Foreign Application Priority Data

Jun. 6, 2003 (JP) ............................. 2003-162759

(51) Int. Cl.
*F01B 31/10* (2006.01)
*F16J 1/14* (2006.01)

(52) U.S. Cl. ......................................... 92/155; 92/187

(58) Field of Classification Search .................. 92/155, 92/157, 158, 187, 216, 255; 74/595
See application file for complete search history.

(56) References Cited

U.S. PATENT DOCUMENTS

| 1,461 | A | 12/1839 | Day |
|---|---|---|---|
| 2,716,972 | A | 9/1955 | Farny et al. |
| 2,982,733 | A | 5/1961 | Wright et al. |
| 3,211,647 | A | 10/1965 | O'Halloran et al. |
| 3,790,315 | A | 2/1974 | Emanuelsson et al. |
| 3,846,162 | A | 11/1974 | Bloom |
| 3,932,228 | A | 1/1976 | Sugiyama et al. |
| 4,031,023 | A | 6/1977 | Musser et al. |
| 4,367,130 | A | 1/1983 | Lemelson |
| 4,385,880 | A | 5/1983 | Lemelson |
| 4,538,929 | A | 9/1985 | Ehrentraut et al. |
| 4,554,208 | A | 11/1985 | MacIver et al. |
| 4,645,610 | A | 2/1987 | Born et al. |
| 4,702,808 | A | 10/1987 | Lemelson |

(Continued)

FOREIGN PATENT DOCUMENTS

CA 2009582 8/1990

(Continued)

OTHER PUBLICATIONS

K. Holmberg et al., "Tribological Characteristics of Diamond-like Carbon Coatings," VTT Symposium, Technical Research Centre of Finland, XP000570636, 1994, pp. 24-238.

(Continued)

*Primary Examiner*—Michael Leslie
(74) *Attorney, Agent, or Firm*—Foley & Lardner LLP

(57) ABSTRACT

An engine piston-pin sliding structure includes a piston pin slidably engaged into a pin boss of an engine piston and having a base and a hard carbon coating formed on the base so as to define a sliding surface slidable over a bearing surface of the pin boss and a lubricant interposed between the sliding surface of the piston pin and the bearing surface of the pin boss. The hard carbon coating contains 25 atomic % or less of hydrogen, and the lubricant contains at least one of an ashless fatty-ester friction modifier and an ashless aliphatic-amine friction modifier.

14 Claims, 1 Drawing Sheet

U.S. PATENT DOCUMENTS

| | | |
|---|---|---|
| 4,712,982 A | 12/1987 | Inagaki et al. |
| 4,755,237 A | 7/1988 | Lemelson |
| 4,755,426 A | 7/1988 | Kokai et al. |
| 4,783,368 A | 11/1988 | Yamamoto et al. |
| 4,834,400 A | 5/1989 | Lebeck |
| 4,842,755 A | 6/1989 | Dunn |
| 4,859,493 A | 8/1989 | Lemelson |
| 4,874,596 A | 10/1989 | Lemelson |
| 4,919,974 A | 4/1990 | McCune et al. |
| 4,943,345 A | 7/1990 | Asmussen et al. |
| 4,960,643 A | 10/1990 | Lemelson |
| 4,974,498 A | 12/1990 | Lemelson |
| 4,980,021 A | 12/1990 | Kitamura et al. |
| 4,980,610 A | 12/1990 | Varga |
| 4,981,717 A | 1/1991 | Thaler |
| 4,988,421 A | 1/1991 | Drawl et al. |
| 4,992,082 A | 2/1991 | Drawl et al. |
| 5,000,541 A | 3/1991 | DiMarcello et al. |
| 5,021,628 A | 6/1991 | Lemelson |
| 5,036,211 A | 7/1991 | Scott |
| 5,040,501 A | 8/1991 | Lemelson |
| 5,067,826 A | 11/1991 | Lemelson |
| 5,077,990 A | 1/1992 | Plath |
| 5,078,848 A | 1/1992 | Anttila et al. |
| 5,087,608 A | 2/1992 | Chan et al. |
| 5,096,352 A | 3/1992 | Lemelson |
| 5,110,435 A | 5/1992 | Haberland |
| 5,112,025 A | 5/1992 | Nakayama et al. |
| 5,127,314 A | 7/1992 | Swain |
| 5,131,941 A | 7/1992 | Lemelson |
| 5,132,587 A | 7/1992 | Lemelson |
| 5,142,785 A | 9/1992 | Grewal et al. |
| 5,143,634 A | 9/1992 | Quinga et al. |
| 5,148,780 A | 9/1992 | Urano et al. |
| 5,187,021 A | 2/1993 | Vydra et al. |
| 5,190,807 A | 3/1993 | Kimock et al. |
| 5,190,824 A | 3/1993 | Itoh |
| 5,202,156 A | 4/1993 | Yamamoto et al. |
| 5,205,188 A | 4/1993 | Repenning et al. |
| 5,232,568 A | 8/1993 | Parent et al. |
| 5,237,967 A | 8/1993 | Willermet et al. |
| 5,249,554 A | 10/1993 | Tamor et al. |
| 5,255,783 A | 10/1993 | Goodman et al. |
| 5,255,929 A | 10/1993 | Lemelson |
| 5,284,394 A | 2/1994 | Lemelson |
| 5,288,556 A | 2/1994 | Lemelson |
| 5,299,937 A | 4/1994 | Gow |
| 5,317,938 A | 6/1994 | de Juan, Jr. et al. |
| 5,326,488 A | 7/1994 | Minokami et al. |
| 5,332,348 A | 7/1994 | Lemelson |
| 5,334,306 A | 8/1994 | Dautremont-Smith et al. |
| 5,349,265 A | 9/1994 | Lemelson |
| 5,358,402 A | 10/1994 | Reed et al. |
| 5,359,170 A | 10/1994 | Chen et al. |
| 5,360,227 A | 11/1994 | Lemelson |
| 5,380,196 A | 1/1995 | Kelly et al. |
| 5,401,543 A | 3/1995 | O'Neill et al. |
| 5,432,539 A | 7/1995 | Anderson |
| 5,433,977 A | 7/1995 | Sarin et al. |
| 5,443,032 A | 8/1995 | Vichr et al. |
| 5,447,208 A | 9/1995 | Lund et al. |
| 5,456,406 A | 10/1995 | Lemelson |
| 5,458,754 A | 10/1995 | Sathrum et al. |
| 5,461,648 A | 10/1995 | Nauflett et al. |
| 5,462,772 A | 10/1995 | Lemelson |
| 5,464,667 A | 11/1995 | Köhler et al. |
| 5,466,431 A | 11/1995 | Dorfman et al. |
| 5,479,069 A | 12/1995 | Winsor |
| 5,482,602 A | 1/1996 | Cooper et al. |
| 5,491,028 A | 2/1996 | Sarin et al. |
| 5,509,841 A | 4/1996 | Winsor |
| 5,516,729 A | 5/1996 | Dawson et al. |
| 5,529,815 A | 6/1996 | Lemelson |
| 5,531,878 A | 7/1996 | Vadgama et al. |
| 5,541,566 A | 7/1996 | Deeney |
| 5,547,716 A | 8/1996 | Thaler |
| 5,551,959 A | 9/1996 | Martin et al. |
| 5,552,675 A | 9/1996 | Lemelson |
| 5,568,391 A | 10/1996 | Mckee |
| 5,593,719 A | 1/1997 | Dearnaley et al. |
| 5,616,372 A | 4/1997 | Conley et al. |
| 5,619,889 A | 4/1997 | Jones et al. |
| 5,628,881 A | 5/1997 | Lemelson |
| 5,630,275 A | 5/1997 | Wexler |
| 5,630,953 A | 5/1997 | Klink |
| 5,653,300 A | 8/1997 | Lund et al. |
| 5,672,054 A | 9/1997 | Cooper et al. |
| 5,688,557 A | 11/1997 | Lemelson et al. |
| 5,707,409 A | 1/1998 | Martin et al. |
| 5,714,202 A | 2/1998 | Lemelson et al. |
| 5,719,109 A | 2/1998 | Tokashiki et al. |
| 5,723,207 A | 3/1998 | Lettington et al. |
| 5,731,046 A | 3/1998 | Mistry et al. |
| 5,735,769 A | 4/1998 | Takemura et al. |
| 5,740,941 A | 4/1998 | Lemelson |
| 5,775,817 A | 7/1998 | Gottemoller et al. |
| 5,786,038 A | 7/1998 | Conley et al. |
| 5,790,146 A | 8/1998 | Anderson |
| 5,793,390 A | 8/1998 | Claflin et al. |
| 5,794,801 A | 8/1998 | Lemelson |
| 5,799,549 A | 9/1998 | Decker et al. |
| 5,806,557 A | 9/1998 | Helge |
| 5,824,387 A | 10/1998 | Boutaghou et al. |
| 5,834,708 A | 11/1998 | Svetal et al. |
| 5,840,662 A | 11/1998 | Nibert et al. |
| 5,843,571 A | 12/1998 | Sho |
| 5,851,962 A | 12/1998 | Kaga |
| 5,866,195 A | 2/1999 | Lemelson |
| 5,871,805 A | 2/1999 | Lemelson |
| 5,881,444 A | 3/1999 | Schaefer et al. |
| 5,901,021 A | 5/1999 | Hirano et al. |
| 5,910,940 A | 6/1999 | Guerra |
| 5,927,897 A | 7/1999 | Attar |
| 5,937,812 A | 8/1999 | Reedy et al. |
| 5,940,975 A | 8/1999 | Decker et al. |
| 5,945,214 A | 8/1999 | Ma et al. |
| 5,947,710 A | 9/1999 | Cooper et al. |
| 5,952,102 A | 9/1999 | Cutler |
| 5,958,261 A | 9/1999 | Offer et al. |
| 5,960,762 A | 10/1999 | Imai |
| 5,967,250 A | 10/1999 | Lund et al. |
| 5,968,596 A | 10/1999 | Ma et al. |
| 5,975,686 A | 11/1999 | Hauck et al. |
| 5,976,707 A | 11/1999 | Grab |
| 5,992,268 A | 11/1999 | Decker et al. |
| 5,993,938 A | 11/1999 | Tsukuda et al. |
| 6,006,415 A | 12/1999 | Schaefer et al. |
| 6,015,597 A | 1/2000 | David |
| 6,016,000 A | 1/2000 | Moslehi |
| 6,023,979 A | 2/2000 | Bills et al. |
| 6,028,393 A | 2/2000 | Izu et al. |
| 6,051,298 A | 4/2000 | Ko et al. |
| 6,056,443 A | 5/2000 | Koike et al. |
| 6,059,460 A | 5/2000 | Ono et al. |
| 6,059,830 A | 5/2000 | Lippincott, III et al. |
| 6,071,597 A | 6/2000 | Yang et al. |
| 6,083,313 A | 7/2000 | Venkatraman et al. |
| 6,083,570 A | 7/2000 | Lemelson et al. |
| 6,095,690 A | 8/2000 | Niegel et al. |
| 6,099,541 A | 8/2000 | Klopotek |
| 6,099,976 A | 8/2000 | Lemelson et al. |
| 6,106,919 A | 8/2000 | Lee et al. |
| 6,124,198 A | 9/2000 | Moslehi |
| 6,139,964 A | 10/2000 | Sathrum et al. |

| | | | | | | |
|---|---|---|---|---|---|---|
| 6,142,481 | A | 11/2000 | Iwashita et al. | 6,592,985 | B2 | 7/2003 | Griffin et al. |
| 6,145,608 | A | 11/2000 | Lund et al. | 6,601,662 | B2 | 8/2003 | Matthias et al. |
| 6,156,439 | A | 12/2000 | Coffinberry | 6,626,949 | B1 | 9/2003 | Townley |
| 6,159,558 | A | 12/2000 | Wolfe et al. | 6,629,906 | B1 | 10/2003 | Chiba et al. |
| 6,160,683 | A | 12/2000 | Boutaghou | 6,637,528 | B2 | 10/2003 | Nishiyama et al. |
| 6,165,616 | A | 12/2000 | Lemelson et al. | 6,638,569 | B2 | 10/2003 | McLaughlin et al. |
| 6,170,156 | B1 | 1/2001 | Lev et al. | 6,645,354 | B1 | 11/2003 | Gorokhovsky |
| 6,171,343 | B1 | 1/2001 | Dearnaley et al. | 6,656,329 | B1 | 12/2003 | Ma et al. |
| 6,173,913 | B1 | 1/2001 | Shafer et al. | 6,658,941 | B1 | 12/2003 | Bills et al. |
| 6,190,514 | B1 | 2/2001 | Ma et al. | 6,666,328 | B2 | 12/2003 | Sykora |
| 6,193,906 | B1 | 2/2001 | Kaneko et al. | 6,666,671 | B1 | 12/2003 | Olver et al. |
| 6,197,120 | B1 | 3/2001 | David | 6,684,513 | B1 | 2/2004 | Clipstone et al. |
| 6,197,428 | B1 | 3/2001 | Rogers | 6,684,759 | B1 | 2/2004 | Gorokhovsky |
| 6,203,651 | B1 | 3/2001 | Järvenkylä et al. | 6,695,865 | B2 | 2/2004 | Boyle et al. |
| 6,205,291 | B1 | 3/2001 | Hughes et al. | 6,699,106 | B2 | 3/2004 | Myoung et al. |
| 6,207,625 | B1 | 3/2001 | Ogano et al. | 6,701,627 | B2 | 3/2004 | Korb et al. |
| 6,227,056 | B1 | 5/2001 | Bills et al. | 6,715,693 | B1 | 4/2004 | Dam et al. |
| 6,237,441 | B1 | 5/2001 | Nishioka et al. | 6,726,993 | B2 | 4/2004 | Teer et al. |
| 6,237,852 | B1 | 5/2001 | Svetal et al. | 6,729,350 | B2 | 5/2004 | Schick |
| 6,238,839 | B1 | 5/2001 | Tomita et al. | 6,729,527 | B2 | 5/2004 | Sonnenreich et al. |
| 6,255,262 | B1 | 7/2001 | Keenan et al. | 6,733,513 | B2 | 5/2004 | Boyle et al. |
| 6,261,424 | B1 | 7/2001 | Goncharenko et al. | 6,739,214 | B2 | 5/2004 | Griffin et al. |
| 6,273,793 | B1 | 8/2001 | Liners et al. | 6,739,238 | B2 | 5/2004 | Ushijima et al. |
| 6,274,220 | B1 | 8/2001 | Tsukuda et al. | 6,740,393 | B1 | 5/2004 | Massler et al. |
| 6,289,593 | B1 | 9/2001 | Decker et al. | 6,745,742 | B2 * | 6/2004 | Meyer .......... 92/153 |
| 6,293,648 | B1 | 9/2001 | Anderson | 6,749,033 | B2 | 6/2004 | Griffin et al. |
| 6,296,552 | B1 | 10/2001 | Boutaghou et al. | 6,753,042 | B1 | 6/2004 | Bakounine et al. |
| 6,305,416 | B1 | 10/2001 | Snel et al. | 6,753,635 | B2 | 6/2004 | Kuhlmann-Wilsdorf |
| 6,309,283 | B1 | 10/2001 | Liners et al. | 6,761,532 | B2 | 7/2004 | Capone et al. |
| 6,311,524 | B1 | 11/2001 | Brennan, III et al. | 6,761,736 | B1 | 7/2004 | Woo et al. |
| 6,316,734 | B1 | 11/2001 | Yang | 6,780,177 | B2 | 8/2004 | Shafirstein et al. |
| 6,322,431 | B1 | 11/2001 | Schaenzer et al. | 6,797,326 | B2 | 9/2004 | Griffin et al. |
| 6,322,719 | B2 | 11/2001 | Kaneko et al. | 6,799,468 | B2 | 10/2004 | Borenstein |
| 6,324,060 | B1 | 11/2001 | Hsu | 6,806,242 | B2 * | 10/2004 | Shirahama et al. ......... 508/291 |
| 6,325,385 | B1 | 12/2001 | Iwashita et al. | 6,818,029 | B2 | 11/2004 | Myoung et al. |
| 6,329,328 | B1 | 12/2001 | Koganei et al. | 6,820,676 | B2 | 11/2004 | Palmaz et al. |
| 6,333,298 | B1 | 12/2001 | Waddoups et al. | 6,821,189 | B1 | 11/2004 | Coad et al. |
| 6,338,881 | B1 | 1/2002 | Sellschopp et al. | 6,821,624 | B2 | 11/2004 | Utsumi et al. |
| 6,340,245 | B1 | 1/2002 | Horton et al. | 6,822,788 | B2 | 11/2004 | Blitstein |
| 6,358,123 | B1 | 3/2002 | Liners et al. | 6,844,068 | B1 | 1/2005 | Miyake et al. |
| 6,367,705 | B1 | 4/2002 | Lee et al. | 6,849,085 | B2 | 2/2005 | Marton |
| 6,368,676 | B1 | 4/2002 | Gaudreau et al. | 6,855,237 | B2 | 2/2005 | Kolpakov et al. |
| 6,377,422 | B1 | 4/2002 | Boutaghou et al. | 6,855,791 | B2 | 2/2005 | Van Doren et al. |
| 6,379,383 | B1 | 4/2002 | Palmaz et al. | 6,861,098 | B2 | 3/2005 | Griffin et al. |
| 6,385,987 | B2 | 5/2002 | Schlom et al. | 6,861,137 | B2 | 3/2005 | Griffin et al. |
| 6,386,468 | B1 | 5/2002 | Neuberger et al. | 6,865,952 | B2 | 3/2005 | Bills et al. |
| 6,399,215 | B1 | 6/2002 | Zhu et al. | 6,866,894 | B2 | 3/2005 | Trankiem et al. |
| 6,401,058 | B1 | 6/2002 | Akalin et al. | 6,871,700 | B2 | 3/2005 | Gorokhovsky |
| 6,439,845 | B1 | 8/2002 | Veres | 6,872,203 | B2 | 3/2005 | Shafirstein et al. |
| 6,439,986 | B1 | 8/2002 | Myoung et al. | 6,878,447 | B2 | 4/2005 | Griffin et al. |
| 6,452,752 | B1 | 9/2002 | Boutaghou | 6,880,469 | B2 | 4/2005 | Frost |
| 6,468,642 | B1 | 10/2002 | Bray et al. | 6,882,094 | B2 | 4/2005 | Dimitrijevic et al. |
| 6,471,979 | B2 | 10/2002 | New et al. | 6,883,476 | B1 | 4/2005 | Nohara et al. |
| 6,494,881 | B1 | 12/2002 | Bales et al. | 6,886,521 | B2 * | 5/2005 | Hamada et al. .......... 123/193.4 |
| 6,523,456 | B1 | 2/2003 | Kobayashi et al. | 6,887,585 | B2 | 5/2005 | Herbst-Dederichs |
| 6,524,212 | B2 | 2/2003 | Ushijima et al. | 6,890,700 | B2 | 5/2005 | Tomita et al. |
| 6,534,141 | B1 | 3/2003 | Hull, Jr. et al. | 6,893,720 | B1 | 5/2005 | Nakahigashi et al. |
| 6,537,310 | B1 | 3/2003 | Palmaz et al. | 6,969,198 | B2 | 11/2005 | Konishi et al. |
| 6,537,429 | B2 | 3/2003 | O'Donnell et al. | 2001/0036800 | A1 | 11/2001 | Liners et al. |
| 6,543,394 | B2 | 4/2003 | Tinney | 2002/0026899 | A1 | 3/2002 | McLaughlin et al. |
| 6,544,308 | B2 | 4/2003 | Griffin et al. | 2002/0031987 | A1 | 3/2002 | Liners et al. |
| 6,553,957 | B1 | 4/2003 | Ishikawa et al. | 2002/0034631 | A1 | 3/2002 | Griffin et al. |
| 6,557,968 | B2 | 5/2003 | Lee et al. | 2002/0034632 | A1 | 3/2002 | Griffin et al. |
| 6,562,445 | B2 | 5/2003 | Iwamura | 2002/0051286 | A1 | 5/2002 | Blitstein |
| 6,562,462 | B2 | 5/2003 | Griffin et al. | 2002/0070357 | A1 | 6/2002 | Kim et al. |
| 6,570,172 | B2 | 5/2003 | Kim et al. | 2002/0074168 | A1 | 6/2002 | Matthias et al. |
| 6,572,651 | B1 | 6/2003 | De Scheerder et al. | 2002/0089571 | A1 | 7/2002 | Lee et al. |
| 6,572,935 | B1 | 6/2003 | He et al. | 2002/0090155 | A1 | 7/2002 | Ushijima et al. |
| 6,572,937 | B2 | 6/2003 | Hakovirta et al. | 2002/0090578 | A1 | 7/2002 | Schaefera et al. |
| 6,585,064 | B2 | 7/2003 | Griffin et al. | 2002/0130219 | A1 | 9/2002 | Parseghian et al. |
| 6,586,069 | B2 | 7/2003 | Dykes et al. | 2002/0148430 | A1 | 10/2002 | Kano et al. |
| 6,589,640 | B2 | 7/2003 | Griffin et al. | 2002/0155015 | A1 | 10/2002 | Esumi et al. |
| 6,592,519 | B1 | 7/2003 | Martinez | 2002/0175476 | A1 | 11/2002 | Chinou et al. |

| | | | | | |
|---|---|---|---|---|---|
| 2003/0012234 A1 | 1/2003 | Watson et al. | EP | 0 286 996 | 10/1988 |
| 2003/0019111 A1 | 1/2003 | Korb et al. | EP | 0 291 006 A2 | 11/1988 |
| 2003/0019332 A1 | 1/2003 | Korb et al. | EP | 0 299 785 | 1/1989 |
| 2003/0021995 A1 | 1/2003 | Griffin et al. | EP | 0308143 B1 | 3/1989 |
| 2003/0034182 A1 | 2/2003 | Griffin et al. | EP | 0 333 416 | 9/1989 |
| 2003/0035957 A1 | 2/2003 | Griffin et al. | EP | 0378378 A1 | 7/1990 |
| 2003/0035958 A1 | 2/2003 | Griffin et al. | EP | 0384772 A1 | 8/1990 |
| 2003/0036341 A1 | 2/2003 | Myoung et al. | EP | 0388800 A2 | 9/1990 |
| 2003/0037640 A1 | 2/2003 | Griffin et al. | EP | 0392125 A1 | 10/1990 |
| 2003/0069632 A1 | 4/2003 | De Scheerder et al. | EP | 0398985 B1 | 11/1990 |
| 2003/0108777 A1 | 6/2003 | Gunsel et al. | EP | 407977 | 1/1991 |
| 2003/0114094 A1 | 6/2003 | Myoung et al. | EP | 0 435 312 | 7/1991 |
| 2003/0128903 A1 | 7/2003 | Yasuda et al. | EP | 0474369 A1 | 3/1992 |
| 2003/0159919 A1 | 8/2003 | Fairbairn et al. | EP | 0 500 253 | 8/1992 |
| 2003/0162672 A1 | 8/2003 | Shirahama et al. | EP | 0511153 A1 | 10/1992 |
| 2003/0168323 A1 | 9/2003 | Frost | EP | 0 529 327 | 3/1993 |
| 2003/0180565 A1 | 9/2003 | Herbst-Dederichs | EP | 0392125 B1 | 3/1993 |
| 2003/0199741 A1 | 10/2003 | Martinez | EP | 0546824 A1 | 6/1993 |
| 2003/0234371 A1 | 12/2003 | Ziegler | EP | 0308143 A1 | 11/1993 |
| 2003/0235691 A1 | 12/2003 | Griffin et al. | EP | 0573943 A1 | 12/1993 |
| 2004/0003638 A1 | 1/2004 | Schaefer et al. | EP | 0619504 A1 | 10/1994 |
| 2004/0008406 A1 | 1/2004 | Blitstein | EP | 0621136 A2 | 10/1994 |
| 2004/0010068 A1 | 1/2004 | Doren et al. | EP | 0624353 A3 | 11/1994 |
| 2004/0011900 A1 | 1/2004 | Gebhardt et al. | EP | 0624354 A3 | 11/1994 |
| 2004/0027018 A1 | 2/2004 | LeBlanc et al. | EP | 0378378 B1 | 1/1995 |
| 2004/0035375 A1 | 2/2004 | Gibisch et al. | EP | 0651069 A1 | 5/1995 |
| 2004/0074467 A1 | 4/2004 | Hamada et al. | EP | 0652301 A1 | 5/1995 |
| 2004/0092405 A1 | 5/2004 | Konishi et al. | EP | 0656458 A3 | 6/1995 |
| 2004/0105806 A1 | 6/2004 | Griffin et al. | EP | 0 661 470 | 7/1995 |
| 2004/0109621 A1 | 6/2004 | Frost | EP | 0396603 B1 | 6/1996 |
| 2004/0155435 A1 | 6/2004 | Griffin et al. | EP | 0 731 190 | 9/1996 |
| 2004/0133301 A1 | 7/2004 | Van Doren et al. | EP | 0388800 B1 | 12/1996 |
| 2004/0154570 A1 | 8/2004 | Mabuchi et al. | EP | 0 759 519 | 2/1997 |
| 2004/0168326 A1 | 9/2004 | Korb et al. | EP | 0474369 B1 | 3/1997 |
| 2004/0184687 A1 | 9/2004 | Morales et al. | EP | 0 818 622 | 1/1998 |
| 2004/0223256 A1 | 11/2004 | Feng et al. | EP | 0652301 B1 | 1/1998 |
| 2004/0241448 A1 | 12/2004 | Kano et al. | EP | 0826790 A1 | 3/1998 |
| 2004/0242435 A1 | 12/2004 | Nishimura et al. | EP | 0842754 A1 | 5/1998 |
| 2004/0244539 A1 | 12/2004 | Korb et al. | EP | 0 870 820 | 10/1998 |
| 2004/0261614 A1 | 12/2004 | Hamada et al. | EP | 0816112 A3 | 10/1998 |
| 2005/0001201 A1 | 1/2005 | Bocko et al. | EP | 0882759 A1 | 12/1998 |
| 2005/0005892 A1 | 1/2005 | Nishimura et al. | EP | 00893677 B1 | 1/1999 |
| 2005/0025975 A1 | 2/2005 | Okamoto et al. | EP | 0624353 B1 | 2/1999 |
| 2005/0035222 A1 | 2/2005 | Hamada et al. | EP | 0656458 B1 | 2/1999 |
| 2005/0037879 A1 | 2/2005 | Murata et al. | EP | 0 905 221 A1 | 3/1999 |
| 2005/0056241 A1 | 3/2005 | Nomura et al. | EP | 0 905 419 | 3/1999 |
| 2005/0061291 A1* | 3/2005 | Nishimura et al. ...... 123/197.4 | EP | 0647318 B1 | 3/1999 |
| 2005/0061636 A1 | 3/2005 | Frost et al. | EP | 0651069 B1 | 3/1999 |
| 2005/0064196 A1 | 3/2005 | Martin et al. | EP | 0949200 A1 | 10/1999 |
| 2005/0082139 A1 | 4/2005 | Ishikawa et al. | EP | 0845154 B1 | 11/1999 |
| 2005/0084390 A1 | 4/2005 | Ueno et al. | EP | 0624354 B1 | 12/1999 |
| 2005/0089685 A1 | 4/2005 | Hamada et al. | EP | 0582676 B1 | 3/2000 |
| 2005/0098134 A1 | 5/2005 | Nishimura et al. | EP | 1063085 A1 | 12/2000 |
| 2005/0100701 A1 | 5/2005 | Hamada et al. | EP | 1 067 211 A1 | 1/2001 |
| 2005/0115744 A1 | 6/2005 | Griffin et al. | EP | 0850126 B1 | 1/2001 |
| 2005/0188942 A1 | 9/2005 | Hamada et al. | EP | 1076087 | 2/2001 |
| 2006/0093839 A1 | 5/2006 | Okamoto et al. | EP | 1078736 A1 | 2/2001 |
| 2006/0207540 A1 | 9/2006 | Matsui et al. | EP | 1109196 A1 | 6/2001 |
| | | | EP | 0778902 B1 | 9/2001 |
| | FOREIGN PATENT DOCUMENTS | | EP | 1 154 012 | 11/2001 |
| | | | EP | 0826790 B1 | 11/2001 |
| DE | 643 034 | 3/1937 | EP | 1034320 B1 | 12/2001 |
| DE | 19507086 A1 | 9/1996 | EP | 0850133 B1 | 1/2002 |
| DE | 19507086 C2 | 9/1996 | EP | 0893677 B1 | 1/2002 |
| DE | 197 04 224 A1 | 8/1997 | EP | 1184480 A2 | 3/2002 |
| DE | 198 15 989 A1 | 10/1999 | EP | 1190791 A3 | 4/2002 |
| DE | 198 25 860 | 12/1999 | EP | 1219464 A2 | 7/2002 |
| DE | 19825860 A1 | 12/1999 | EP | 1 233 054 A1 | 8/2002 |
| DE | 100 17 459 | 10/2000 | EP | 0971812 B1 | 10/2002 |
| DE | 100 61 397 A1 | 5/2002 | EP | 1018291 B1 | 10/2002 |
| DE | 101 58 683 | 6/2003 | EP | 1281513 A2 | 2/2003 |
| DE | 103 18 135 | 11/2003 | EP | 1 300 608 | 4/2003 |
| DE | 10337559 A1 | 3/2005 | EP | 0950123 B1 | 5/2003 |

| | | | | | | |
|---|---|---|---|---|---|---|
| EP | 0882759 | B1 | 6/2003 | JP | 2003-25117 | 1/2003 |
| EP | 1 338 641 | A1 | 8/2003 | JP | 2003-28174 A2 | 1/2003 |
| EP | 1340605 | A1 | 9/2003 | JP | 2003-88939 | 3/2003 |
| EP | 1365141 | A1 | 11/2003 | JP | 2003-113941 | 4/2003 |
| EP | 1083946 | B1 | 12/2003 | JP | 2003-147508 | 5/2003 |
| EP | 1078736 | B1 | 1/2004 | JP | 2004-36788 A2 | 2/2004 |
| EP | 1378271 | A1 | 1/2004 | JP | 2005-68529 A2 | 3/2005 |
| EP | 0757615 | B1 | 3/2004 | RU | 2004586 C1 | 12/1993 |
| EP | 0842754 | B1 | 3/2004 | RU | 2153782 C1 | 7/2000 |
| EP | 1 411 145 | A1 | 4/2004 | SU | 1770350 | 10/1992 |
| EP | 0862395 | B1 | 4/2004 | WO | WO 89/06707 A1 | 7/1989 |
| EP | 1 418 353 | A2 | 5/2004 | WO | WO 89/06708 A1 | 7/1989 |
| EP | 1440775 | A1 | 7/2004 | WO | WO 8906338 A1 | 7/1989 |
| EP | 1445119 | A1 | 8/2004 | WO | WO 92/02602 A1 | 2/1992 |
| EP | 1475557 | A1 | 11/2004 | WO | WO 9206843 A1 | 4/1992 |
| EP | 1481699 | A1 | 12/2004 | WO | WO 9219425 A2 | 11/1992 |
| EP | 1482190 | A2 | 12/2004 | WO | WO 93/21288 | 10/1993 |
| EP | 1498597 | A1 | 1/2005 | WO | WO 93/21289 A1 | 10/1993 |
| EP | 1 510 594 | A2 | 3/2005 | WO | WO 9324828 A1 | 12/1993 |
| EP | 1311885 | B1 | 3/2005 | WO | WO 95/20253 A2 | 7/1995 |
| EP | 1512781 | A2 | 3/2005 | WO | WO 95/29044 A1 | 11/1995 |
| EP | 1183470 | B1 | 4/2005 | WO | WO 95/29273 A1 | 11/1995 |
| EP | 1 661 971 | A1 | 5/2006 | WO | WO 95/31584 A1 | 11/1995 |
| FR | 2 669 689 | | 5/1992 | WO | WO 96/04485 | 2/1996 |
| GB | 768226 | | 2/1957 | WO | WO 96/05333 A1 | 2/1996 |
| GB | 1005638 | | 10/1988 | WO | WO 96/05942 A1 | 2/1996 |
| GB | 2338716 | | 12/1999 | WO | WO 96/06961 A1 | 3/1996 |
| IE | 0990532 | A1 | 3/2001 | WO | WO 96/12389 A1 | 4/1996 |
| JP | 62-111106 | | 5/1987 | WO | WO 96/24488 A1 | 8/1996 |
| JP | 63-21209 | A2 | 1/1988 | WO | WO 96/40446 A1 | 12/1996 |
| JP | 63-288994 | A2 | 11/1988 | WO | WO 97/07531 A1 | 2/1997 |
| JP | 5-70879 | | 3/1993 | WO | WO 97/10093 A1 | 3/1997 |
| JP | 5-36004 | | 5/1993 | WO | WO 97/10940 A1 | 3/1997 |
| JP | 5-42616 | | 6/1993 | WO | WO 97/14555 | 4/1997 |
| JP | 6-264993 | | 9/1994 | WO | WO 97/16138 A1 | 5/1997 |
| JP | 6-294307 | | 10/1994 | WO | WO 98/02715 A1 | 1/1998 |
| JP | 7-63135 | | 3/1995 | WO | WO 98/12994 A1 | 4/1998 |
| JP | 07-090553 | | 4/1995 | WO | WO 98/13528 A1 | 4/1998 |
| JP | 7-103238 | | 4/1995 | WO | WO 98/47141 A1 | 10/1998 |
| JP | 07-118832 | | 5/1995 | WO | WO 99/09547 A1 | 2/1999 |
| JP | 7-41386 | A2 | 10/1995 | WO | WO 99/12404 A1 | 3/1999 |
| JP | 7-286696 | A | 10/1995 | WO | WO 99/14512 A1 | 3/1999 |
| JP | 8-14014 | | 1/1996 | WO | WO 99/16371 A1 | 4/1999 |
| JP | 8-61499 | A | 3/1996 | WO | WO 99/22694 A2 | 5/1999 |
| JP | 9-20981 | A2 | 1/1997 | WO | WO 99/27157 A1 | 6/1999 |
| JP | 52006318 | | 1/1997 | WO | WO 99/29477 A1 | 6/1999 |
| JP | 253770 | A2 | 9/1997 | WO | WO 99/31557 A1 | 6/1999 |
| JP | 10-088369 | A2 | 4/1998 | WO | WO 99/34385 A1 | 7/1999 |
| JP | 10-265790 | | 10/1998 | WO | WO 99/46847 A1 | 9/1999 |
| JP | 10-298440 | A2 | 11/1998 | WO | WO 99/54520 A1 | 10/1999 |
| JP | 11-22423 | | 1/1999 | WO | WO 99/54934 A1 | 10/1999 |
| JP | 11-190406 | | 7/1999 | WO | WO 99/57743 A1 | 11/1999 |
| JP | 11-292629 | A2 | 10/1999 | WO | WO 99/62077 A1 | 12/1999 |
| JP | 11-294118 | | 10/1999 | WO | WO 99/62572 A1 | 12/1999 |
| JP | 11-333773 | A2 | 12/1999 | WO | WO 00/22613 A1 | 4/2000 |
| JP | 2000-88104 | | 3/2000 | WO | WO 00/24554 A1 | 5/2000 |
| JP | 2000-119843 | | 4/2000 | WO | WO 00/25410 A1 | 5/2000 |
| JP | 2000-504089 | | 4/2000 | WO | WO 00/28142 A1 | 5/2000 |
| JP | 2000-297373 | | 10/2000 | WO | WO 00/33051 A1 | 6/2000 |
| JP | 2000-327484 | | 11/2000 | WO | WO 00/35000 A1 | 6/2000 |
| JP | 2000-339083 | | 12/2000 | WO | WO 00/44032 A1 | 7/2000 |
| JP | 2001-62605 | | 3/2001 | WO | WO 00/47402 A1 | 8/2000 |
| JP | 2001-64005 | | 3/2001 | WO | WO 00/55385 A1 | 9/2000 |
| JP | 2001-93141 | A2 | 4/2001 | WO | WO 00/56127 A1 | 9/2000 |
| JP | 2001-172766 | A2 | 6/2001 | WO | WO 00/56393 A1 | 9/2000 |
| JP | 2001-192864 | | 7/2001 | WO | WO 00/62327 A2 | 10/2000 |
| JP | 2001-269938 | | 10/2001 | WO | WO 00/68451 A2 | 11/2000 |
| JP | 2001-280236 | | 10/2001 | WO | WO 00/75517 A1 | 12/2000 |
| JP | 2002-265968 | A2 | 9/2002 | WO | WO 00/78504 A1 | 12/2000 |
| JP | 2002-309912 | | 10/2002 | WO | WO 01/05917 | 1/2001 |
| JP | 2002-332571 | | 11/2002 | WO | WO 01/006033 A1 | 2/2001 |
| JP | 2003-13163 | | 1/2003 | WO | WO 01/14736 A1 | 3/2001 |
| JP | 2003-13799 | | 1/2003 | WO | WO 01/14745 A1 | 3/2001 |

| | | |
|---|---|---|
| WO | WO 01/26862 A1 | 4/2001 |
| WO | WO 01//37631 A2 | 5/2001 |
| WO | WO 01/40537 A1 | 6/2001 |
| WO | WO 01/47451 A1 | 7/2001 |
| WO | WO 01/59544 A2 | 8/2001 |
| WO | WO 01/61182 | 8/2001 |
| WO | WO 01/61719 A1 | 8/2001 |
| WO | WO 01/62372 A1 | 8/2001 |
| WO | WO 01/63639 A1 | 8/2001 |
| WO | WO 01/67834 A1 | 9/2001 |
| WO | WO 01/79583 A2 | 10/2001 |
| WO | WO 01/80224 A2 | 10/2001 |
| WO | WO 02/006875 A1 | 1/2002 |
| WO | WO 02/13188 A1 | 2/2002 |
| WO | WO 02/24601 A1 | 3/2002 |
| WO | WO 02/24603 A1 | 3/2002 |
| WO | WO 02/24970 A2 | 3/2002 |
| WO | WO 02/32625 A2 | 4/2002 |
| WO | WO 02/44440 A1 | 6/2002 |
| WO | WO 02/054454 A2 | 7/2002 |
| WO | WO 02/062714 A2 | 8/2002 |
| WO | WO 02/073021 | 9/2002 |
| WO | WO 02/080996 A1 | 10/2002 |
| WO | WO 02/085237 A2 | 10/2002 |
| WO | WO 02/090461 A1 | 11/2002 |
| WO | WO 02/097289 A1 | 12/2002 |
| WO | WO 03/009978 A1 | 2/2003 |
| WO | WO 03/013990 A1 | 2/2003 |
| WO | WO 03/020329 A1 | 3/2003 |
| WO | WO 03/021731 A1 | 3/2003 |
| WO | WO 03/031543 A2 | 4/2003 |
| WO | WO 03/054876 A1 | 7/2003 |
| WO | WO 03/076309 A2 | 9/2003 |
| WO | WO 03/078679 A1 | 9/2003 |
| WO | WO 03/091758 A2 | 11/2003 |
| WO | WO 2003/095009 A1 | 11/2003 |
| WO | WO 03/105134 A1 | 12/2003 |
| WO | WO 2004/001804 A2 | 12/2003 |
| WO | WO 2004/004998 A1 | 1/2004 |
| WO | WO 2004/019809 A2 | 3/2004 |
| WO | WO 2004/024206 A1 | 3/2004 |
| WO | WO 2004/026359 A1 | 4/2004 |
| WO | WO 2004/026500 A2 | 4/2004 |
| WO | WO 2004/036169 A1 | 4/2004 |
| WO | WO 2004/036292 A2 | 4/2004 |
| WO | WO 2004/038701 A2 | 5/2004 |
| WO | WO 2004/043631 A1 | 5/2004 |
| WO | WO 2004/048126 A2 | 6/2004 |
| WO | WO 2004/067466 A1 | 8/2004 |
| WO | WO 2004/068530 A1 | 8/2004 |
| WO | WO 2004/071670 A1 | 8/2004 |
| WO | WO 2004/072959 A2 | 8/2004 |
| WO | WO 2004/078424 A2 | 9/2004 |
| WO | WO 2004/084773 A1 | 10/2004 |
| WO | WO 2004/088113 A1 | 10/2004 |
| WO | WO 2005/010596 A2 | 2/2005 |
| WO | WO 2005/011744 A2 | 2/2005 |
| WO | WO 2005/014760 A1 | 2/2005 |
| WO | WO 2005/014763 A1 | 2/2005 |
| WO | WO 2005/014882 A1 | 2/2005 |
| WO | WO 2005/016620 A2 | 2/2005 |
| WO | WO 2005/021851 A1 | 3/2005 |
| WO | WO 2005025844 A1 | 3/2005 |
| WO | WO 2005/034791 A1 | 4/2005 |
| WO | WO 2005/037144 A2 | 4/2005 |
| WO | WO 2005/037985 A2 | 4/2005 |
| WO | WO 2005/040451 A1 | 5/2005 |
| WO | WO 2005/042064 A1 | 5/2005 |
| WO | WO 2005/047737 A1 | 5/2005 |
| WO | WO 2003/046508 A3 | 6/2005 |
| WO | WO 2006/075219 A2 | 7/2006 |

OTHER PUBLICATIONS

"Standard Test Method for Separation of Representative Aromatics and Nonaromatics Fractions of High-Boiling Oils by Elution Chromatography[1]", ASTM Designation : D2549—91 (Reapproved 1995), pp. 895-900.

International Standard, "Petroleum Products—Determination of Base Number—Perchloric Acid Potentiometric Titration Method", ISO 3771, Second Edition Aug. 15, 1994, pp. 1-8.

Japanese Industrial Standard, "Structural Steels with Specified Hardenability Bands", JIS G 4052, 1979, pp. 2414, 2415, 1390-1403, 1410 and 1411.

Japanese Industrial Standard, "Aluminium Alloy Castings", JIS H 5202, 1999, pp. 1910, 1911 and 1636-1647.

Gåhlin, Rickard et al., "ME-C:H Coatings in Motor Vehicles," WEAR 249, 2001, pp. 302-309.

Hershberger, J., et al., "Evaluation of DLC Coatings for Spark-Ignited, Direct-Injected Fuel Systems," *Surface & Coatings Technology*, 179, 2004, pp. 237-244.

Hershberger, J, et al., "Friction and Wear Behavior of Near-Frictionless Carbon Coatings in Formulated Gasolines," *Surface & Coating Technology*, 183, 2004, pp. 111-117.

Kovalchenko, A., et al., "Friction and Wear Performance of Low-Friction Carbon Coatings Under Oil Lubrication," Energy Technology Div., Argonne National Laboratory.

Ajayi, O., et al., "Effect of Carbon Coating on Scuffing Performance in Diesel Fuels," *Tribology Transactions*, vol. 44, 2001, pp. 298-304.

Ajayi, O., et al., Effect of Thin-Film Coating on Wear in EGR-Contaminated Oil, Energy Technology Div., Argonne National Laboratory.

Fujimori, N., et al., "Characterization of Conducting Diamond Films," *Vacuum*, vol. 36, Nos. 1-3, 1996, pp. 99-102.

Patent/Literature Search, Bawa Biotechnology Consulting, LLC, Jun. 3, 2005, pp. 1-201.

"Aluminium Alloy De Castings," Japanese Industrial Standard (JIS H 5302), 2000, pp. 1-12.

"Aluminium Alloys Castings", Japanese Industrial Standard (JIS H 5202), 1999 (18 pages).

"Aluminum Alloy Die Castings," JIS H5302 (2000), pp. 1670-1681.

"Assessment of 2nd to 5th Order Irregularities of Surface Configuration by Means of Sections of Surfaces Definitions Relating to Reference System and Dimensions," DIN 4762, UDC 621-288:001.4 (Aug. 1960), pp. 1-4.

API Motor Oil Guide, Which Oil is Right for You, American Petroleum Institute, Copyright 2002.

"Carbon Steels for Machine Structural Use", Japanese Industrial Standard (JIS G 4051), 1979, pp. 1381-1383.

"Carbon Steels for Machine Structural Use", Japanese Industrial Standard (JIS G 4051), 1979, pp. 1-10.

"Chromium Molybdenum Steels," Japanese Industrial Standard (JIS G 4105), 1979, pp. 1-11 (with Translation).

"Chromium Steels," Japanese Industrial Standard (JIS G 4104), 1979, pp. 1-9.

D.G. Watson et al., "Engineering Drawing Practice," XP002281300, University of Hertfordshire, Sep. 1991, p. 29, Figure 38.

Database WPI, Nov. 28, 2000, Derwent Publications, Ltd., AN 2000640583, XP002240184, JP 2000-327484, Nov. 28, 2000.

Dr. Marx, "Surfaces and Contact Mechanics", XP-002233233, Google, Retrieved from the Internet, Mar. 3, 2003, pp. 1-18.

Engine Oil Viscosity Classification—SAE J300 revised Apr. 1997, p. 133.

"Geometrical Product Specifications (GPS)—Surface Texture: Profile Method—Terms, Definitions and Surface Texture Parameters," International Standard, ISO 4287, TC 213 (1997), pp. 1-25.

"Geometrical Product Specifications (GPS)—Surface texture: Profile method—Terms, definitions and surface texture parameters", Japanese Industrial Standard (JIS B 0601) Machine Elements, 2003, pp. 6, 7, 263-287, and 2586.

"Grey iron castings", Japanese Industrial Standard (JIS G 5501), pp. 2075-2077.

Japanese Industrial Standard, "High Carbon Chromium Bearing Steels", JIS G 4805, 1999, pp. 1-31 (with translation).

International Standard "Application of Carbides for Machining by Chip Removal—Designation of the Main Groups of Chip Removal and Groups of Application," ISO 513, (1975), pp. 67-69.

JIS Japanese Industrial Standard; "Surface Roughness—Definitions and Designation"; JIS B 0601; 1994. (w/Translation).

JIS Japanese Industrial Standard; "Vickers Hardness Test—Test Method"; JIS Z 2244; 1998; (w/Translation).

Japanese Industrial Standard, 2001, No. B 0601.

Kano et al., "Friction Characteristics of a Hard Carbon Film in Engine Oil, (No. 2) (Surface Analysis Result of Sliding Surface)," Japan Tribology Congress 1999, 5, pp. 11-12.

M. Kano et al., "The Effect of ZDDP and MODTC Additives on Friction Properties of DLC and Steel Cam Follower in Engine Oil", Abstracts of Papers from 2nd World Tribology Congress, Sep. 3-7, 2001, p. 342.

Meyer-Rässler, "Neuartige Laufflächen-Schutzverfahren für Kolben von Verbrennungsmotoren," VDI-Zeitschrift, 1942, vol. 86, No. 15/16, pp. 245 to 247.

Patent Abstracts of Japan, vol. 1996, No. 09, Sep. 30, 1996, JP 08-128448, May 21, 1996.

Patent Abstracts of Japan, vol. 2000, No. 01, Jan. 31, 2000, JP 11-287329, Oct. 19, 1999.

Patent Abstracts of Japan, vol. 2000, No. 09, Oct. 13, 2000, JP 2000-170768, Jun. 20, 2000.

PCT/IB2004/002552.

"Stainless Steel Bars", Japanese Industrial Standard (JIS G 4303), pp. 1457-1477.

"Standard Practice for Codification of Certain Nonferrous Metals and Alloys, Cast and Wrought1", ASTM International, Designation: B 275-02, Jun. 2002, pp. 1-7.

"Standard Test Method for Calibration and Operation of the Falex Block-on-Ring Friction and Wear Testing Machine", ASTM Designation: D2714-88, Jan. 1989, pp. 383-386.

Steve J. Bull et al., "High-Performance Diamond and Diamond-like Coatings", JOM, Apr. 1995, pp. 16-19, vol. 47, No. 4, XP 000500980.

Patent Abstracts of Japan, vol. 2003, No. 12, Dec. 5, 2003, JP 2004-155891, Jun. 3, 2004.

Ronkainen, Helena, "Tribological Properties of Hydrogenated and Hydrogen-Free Diamond-Like Carbon Coatings," Disseration for the Degree of Doctor of Science in Technology, VTT Publications No. 434.

Takahiro Hamada, Takafumi Ueno, Yutaka Mabuchi, Makoto Kano, "Evaluation of DLC Thin Film Deposition Using Pin-Disk Apparatus," Proceedings of JAST Tribology Conference, Tokyo, Japan, May 2004.

Takahiro Hamada, Takafumi Ueno, Yutaka Mabuchi, Makoto Kano, Power Point Presentation Titled: "Evaluation of DLC Thin Film Deposition Using Pin-Disk Apparatus" Shown During Meeting of Japanese Society of Tribologists Held on May 10-12, 2004 in Tokyo, Japan.

\* cited by examiner

ENGINE PISTON-PIN SLIDING STRUCTURE

BACKGROUND OF THE INVENTION

The present invention relates to a technique for providing an engine piston pin with low-friction characteristics and durability.

Global environmental problems, such as global warming and ozone layer destruction, are coming to the fore. The global warming is significantly effected by $CO_2$ emission, and the reduction of $CO_2$ emission (notably, the setting of $CO_2$ emission standards) has become a big concern to each country.

Herein, one of the challenges to $CO_2$ emission control is to improve vehicle fuel efficiency. The sliding friction of piston pins against piston pin bosses in a vehicle engine is largely responsible for engine mechanical losses. It is thus important to reduce the friction between the piston pins and pin bosses in order to provide a direct improvement in vehicle fuel efficiency.

There are effective ways to reduce the friction between the piston pins and pin bosses: one way is to protect the piston pins from seizing, and another way is to save the weight of the piston pins while preventing the piston pins from wear. For example, Japanese Laid-Open Patent Publication No. 7-286696 proposes covering the piston pins with high-hardness metal coatings so that the so that the piston pins become more resistant to seizure. Further, Japanese Laid-Open Patent Publication No. 8-061499 proposes forming the piston pins from a ceramic material so that the piston pins become lightweight and resistant to wear.

SUMMARY OF THE INVENTION

However, these proposals have proven unable to produce so significant friction reducing effect as expected.

It is therefore an object of the present invention to provide an engine piston pin with high seizure resistance so as to obtain a significant friction reducing effect.

As a result of extensive researches, it was found by the inventors that a hard-carbon coated engine piston pin shows excellent low-friction characteristics in the presence of a lubricant containing a specific ashless friction modifier or modifiers. The present invention has been accomplished based on the above finding.

According to a first aspect of the present invention, there is provided an engine piston-pin sliding structure, comprising: a piston pin slidably engaged into a pin boss of an engine piston, the piston pin having a pin base and a hard carbon coating formed on the pin base so as to define a sliding surface slidable over a bearing surface of the pin boss, the hard carbon coating containing 25 atomic % or less of hydrogen; and a lubricant interposed between the sliding surface of the piston pin and the bearing surface of the pin boss, the lubricant containing at least one of an ashless fatty-ester friction modifier and an ashless aliphatic-amine friction modifier.

According to a second aspect of the present invention, there is provided a piston pin to be slidably engaged into a pin boss of an engine piston with a lubricant interposed between the piston pin and pin boss, the lubricant containing at least one of an ashless fatty-acid friction modifier and an ashless aliphatic-amine friction modifier, the piston pin comprising: a pin base; and a hard carbon coated formed on the pin base so as to define a sliding surface slidable over a bearing surface of the pin boss via the lubricant, the hard carbon coating having 25 atomic % less of hydrogen.

The other objects and features of the invention will also become understood from the following description.

DESCRIPTION OF THE EMBODIMENTS

The present invention will be described below in detail. In the following description, all percentages (%) are by mass unless otherwise specified.

According to one exemplary embodiment of the present invention, there is provided a piston-pin sliding structure for a vehicle engine, including a piston pin 1 slidably engaged into a pin boss of a piston (not shown) of the engine and a lubricant interposed between the piston pin and pin boss.

Figure 1A:
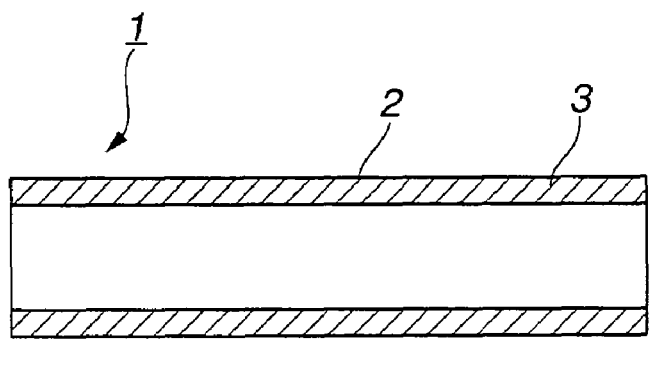
FIG. 1A is a sectional view of a piston pin according to one exemplary embodiment of the present invention.
Figure 1B:
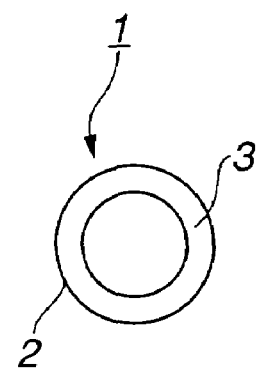
FIG. 1B is an end view of the piston pin according to one exemplary embodiment of the present invention.
Figure 1C:
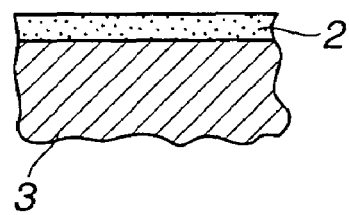
FIG. 1C is an enlarged sectional view of a part of the piston pin according to one exemplary embodiment of the present invention.

The piston pin 1 has a cylindrical pin base 3 made of a steel or aluminum material and a hard carbon coating 2 formed on the pin base 3, as illustrated in FIGS. 1A, 1B and 1C, so as to define a sliding surface slidable over a bearing surface of the pin boss.

The hard carbon coating 2 can be formed by various physical vapor deposition (PVD) methods, and is desirably a diamond-like carbon (DLC) coating formed by arc ion plating. The DLC coating is a coating of amorphous carbon, such as hydrogen-free amorphous carbon (a-C), hydrogen-containing amorphous carbon (a-C:H) and metal-containing carbon or metal carbide (MeC) that contains metal elements of e.g. titanium (Ti) or molybdenum (Mo). In order to obtain a larger friction reducing effect, it is desirable to minimize the amount of hydrogen in the DLC coating. The hydrogen content of the DLC coating is preferably 25 atomic % or less, more preferably 5 atomic % or less, still more preferably 0.5 atomic % or less. In particular, the hydrogen-free amorphous carbon coating is suitably used.

Further, the sliding surface of the piston pin 1 defined by the hard carbon coating 2 reflects the surface roughness of the pin base 3. When the pin base 3 has an arithmetic mean surface roughness Ra exceeding 0.3 μm, the hard carbon coating 2 becomes susceptible to cracking due to increased local contact of the surface roughness peaks of the hard carbon coating 2 with the counterpart member (i.e. the pin boss). It is thus preferable to control the surface roughness Ra of the pin base 3 to be covered with the hard carbon coating 3 to 0.03 μm or lower.

On the other hand, the lubricant includes a base oil and at least one of an ashless fatty-ester friction modifier and an ashless aliphatic-amine friction modifier to lubricate the sliding surface of the piston pin 1 and the bearing surface of the pin boss such that the sliding surface of the piston pin makes sliding contact with the bearing surface of the pin boss via the lubricant.

The base oil is not particularly limited, and can be selected from any commonly used lube compounds, such as mineral oils, synthetic oils, and fats.

Specific examples of the mineral oils include normal paraffins and paraffin or naphthene oils each prepared by extracting lubricant fractions from petroleum by atmospheric or reduced-pressure distillation, and then, purifying the obtained lubricant fractions with at least one of the following treatments: solvent deasphalting, solvent extraction, hydrocracking, solvent dewaxing, hydro-refining, wax isomerization, surfuric acid treatment and clay refining. Although the solvent-refined or hydro-refined mineral oil is often used as the base oil, it is more desirable to use the mineral oil prepared by Gas-To-Liquids (GTL) wax isomerization or by deep hydrocraking for reduction of an aromatics content in the oil.

Specific examples of the synthetic oils include: poly-α-olefins (PAO), such as 1-octene oligomer, 1-decene oligomer and ethylene-propylene oligomer, and hydrogenated products thereof; isobutene oligomer and a hydrogenated product thereof; isoparaffines; alkylbenzenes; alkylnaphthalenes; diesters, such as ditridecyl glutarate, dioctyl adipate, diisodecyl adipate, ditridecyl adipate and dioctyl sebacate; polyol esters, such as trimethylolpropane esters (e.g. trimethylolpropane caprylate, trimetylolpropane pelargonate and trimethylolpropane isostearate) and pentaerythritol esters (e.g. pentaerythritol-2-ethyl hexanoate and pentaerythritol pelargonate); polyoxyalkylene glycols; dialkyl diphenyl ethers; and polyphenyl ethers. Among these synthetic oil compounds, preferred are poly-α-olefins, such as 1-octene oligomer and 1-decene oligomer, and hydrogenated products thereof.

The above-mentioned base oil compounds can be used alone or in combination thereof. In the case of using as the base oil a mixture of two or more of the above base oil compounds, there is no particular limitation to the mixing ratio of the base oil compounds.

The sulfur content of the base oil is not particularly restricted, and is preferably 0.2% or less, more preferably 0.1% or less, still more preferably 0.05% or lower, based on the total mass of the base oil. It is desirable to use the hydro-refined mineral oil or the synthetic oil because the hydro-refined mineral oil and the synthetic oil each has a sulfur content of not more than 0.005% or substantially zero (lower than a detection limit of e.g. 5 ppm).

The aromatics content of the base oil is not also particularly restricted. Herein, the aromatics content is defined as the amount of an aromatics fraction determined according to ASTM D2549. In order for the lubricant to maintain low-friction characteristics over time, the aromatic content of the base oil is preferably 15% or less, more preferably 10% or less, and still more preferably 5% or less, based on the total mass of the base oil. The lubricant undesirably deteriorates in oxidation stability when the aromatics content of the base oil exceeds 15%.

The kinematic viscosity of the base oil is not particularly restricted. The kinematic viscosity of the base oil is preferably 2 mm$^2$/s or higher, more preferably 3 mm$^2$/s, as measured at 100° C. At the same time, the kinematic viscosity of the base oil is preferably 20 mm$^2$/S or lower, more preferably 10 mm$^2$/S or lower, still more preferably 8 mm$^2$/s or lower, as measured at 100° C. When the kinematic viscosity of the base oil is less than 2 mm$^2$/s at 100° C., there is a possibility that the lubricant fails to provide sufficient wear resistance and causes a considerable evaporation loss. When the kinematic viscosity of the base oil exceeds 20 mm$^2$/s at 100° C., there is a possibility that the lubricant fails to provide low-friction characteristics and deteriorates in low-temperature performance. In the case of using two or more of the above-mentioned base oil compounds in combination, it is not necessary to limit the kinematic viscosity of each base oil compound to within such a specific range so long as the kinematic viscosity of the mixture of the base oil compounds at 100° C. is in the specified range.

The viscosity index of the base oil is not particularly restricted, and is preferably 80 or higher, more preferably 100 or higher, most preferably 120 or higher, in order for the lubricant to attain improved oil-consumption performance as well as low-temperature viscosity characteristics.

As the fatty-ester friction modifier and the aliphatic-amine friction modifier, there may be used fatty acid esters and aliphatic amines each having $C_6$–$C_{30}$ straight or branched hydrocarbon chains, preferably $C_8$–$C_{24}$ straight or branched hydrocarbon chains, more preferably $C_{10}$–$C_{20}$ straight or branched hydrocarbon chains. When the carbon number of the hydrocarbon chain of the friction modifier is not within the range of 6 to 30, there arises a possibility of failing to produce a desired friction reducing effect. Specific examples of the $C_6$–$C_{30}$ straight or branched hydrocarbon chain include: alkyl groups, such as hexyl, heptyl, octyl, nonyl, decyl, undecyl, dodecyl, tridecyl, tetradecyl, pentadecyl, hexadecyl, heptadecyl, octadecyl, nonadecyl, icosyl, heneicosyl, docosyl, tricosyl, tetracosyl, pentacosyl, hexacosyl, heptacosyl, octacosyl, nonacosyl and triacontyl; and alkenyl groups, such as hexenyl, heptenyl, octenyl, nonenyl, decenyl, undecenyl, dodecenyl, tridecenyl, tetradecenyl, pentadecenyl, hexadecenyl, heptadecenyl, octadecenyl, nonadecenyl, icosenyl, heneicosenyl, docosenyl, tricosenyl, tetracosenyl, pentacosenyl, hexacosenyl, heptacosenyl, octacosenyl, nonacosenyl and triacontenyl. The above alkyl and alkenyl groups include all possible isomers.

The fatty acid ester is exemplified by esters of fatty acids having the above hydrocarbon groups and monofunctional aliphatic alcohols or aliphatic polyols. Specific examples of such fatty acid esters include glycerol monolate, glycerol diolate, sorbitan monolate and sorbitan diolate.

The aliphatic amine is exemplified by aliphatic monoamines and alkylene oxide adducts thereof, aliphatic polyamines, imidazolines and derivatives thereof each having the above hydrocarbon groups. Specific examples of such aliphatic amines include: aliphatic amine compounds, such as laurylamine, lauryldiethylamine, lauryldiethanolamine, dodecyldipropanolamine, palmitylamine, stearylamine, stearyltetraethylenepentamine, oleylamine, oleylpropylenediamine, oleyldiethanolamine and N-hydroxyethyloleylimidazolyne; alkylene oxide adducts of the above aliphatic amine compounds, such as N,N-dipolyoxyalkylene-N-alkyl or alkenyl ($C_6$–$C_{28}$) amines; and acid-modified compounds prepared by reacting the above aliphatic amine compounds with $C_2$–$C_{30}$ monocarboxylic acids (such as fatty acids) or $C_2$–$C_{30}$ polycarboxylic acids (such as oxalic acid, phthalic acid, trimellitic acid and pyromellitic acid) so as to neutralize or amidate the whole or part of the remaining amino and/or imino groups. Above all, N,N-dipolyoxyethylene-N-oleylamine is preferably used.

The amount of the fatty-ester friction modifier and/or the aliphatic-amine friction modifier added in the lubricant is not particularly restricted, and is preferably 0.05 to 3.0%, more preferably 0.1 to 2.0%, and most preferably 0.5 to 1.4%, based on the total mass of the lubricant. When the amount of the fatty-ester friction modifier and/or the aliphatic-amine friction modifier in the lubricant is less than 0.05%, there is a possibility of failing to obtain a sufficient friction reducing effect. When the amount of the fatty-ester friction modifier and/or the aliphatic-amine friction modifier in the lubricant exceeds 3.0%, there is a possibility that the solubility of the friction modifier or modifiers in the base oil becomes so low that the lubricant deteriorates in storage stability to cause precipitations.

The lubricant preferably includes polybutenyl succinimide and/or a derivative thereof as an ashless dispersant.

As the polybutenyl succinimide, there may be used compounds represented by the following general formulas (1) and (2)

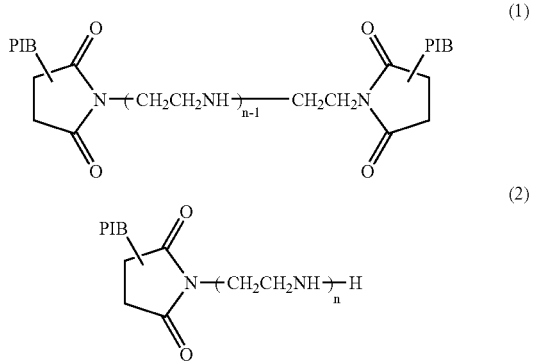

In the formulas (1) and (2), PIB represents a polybutenyl group derived from polybutene having a number-average molecular weight of 900 to 3,500, preferably 1,000 to 2,000, that can be prepared by polymerizing high-purity isobutene or a mixture of 1-butene and isobutene in the presence of a boron fluoride catalyst or aluminum chloride catalyst. When the number-average molecular weight of the polybutene is less than 900, there is a possibility of failing to provide a sufficient detergent effect. When the number-average molecular weight of the polybutene exceeds 3,500, the polybutenyl succinimide tends to deteriorate in low-temperature fluidity. The polybutene may be purified, before used for the production of the polybutenyl succinimide, by removing trace amounts of fluorine and chlorine residues resulting from the above polybutene production catalyst with any suitable treatment (such as adsorption process or washing process) in such a way as to control the amount of the fluorine and chlorine residues in the polybutene to 50 ppm or less, desirably 10 ppm or less, more desirably 1 ppm or less.

Further, n represents an integer of 1 to 5, preferably 2 to 4, in the formulas (1) and (2) in view of the detergent effect.

The production method of the polybutenyl succinimide is not particularly restricted. For example, the polybutenyl succinimide can be prepared by reacting a chloride of the polybutene, or the polybutene from which fluorine and chlorine residues are sufficiently removed, with maleic anhydride at 100 to 200° C. to form polybutenyl succinate, and then, reacting the thus-formed polybutenyl succinate with polyamine (such as diethylene triamine, triethylene tetramine, tetraethylene pentamine or pentaethylene hexamine).

As the polybutenyl succinimide derivative, there may be used boron- or acid-modified compounds obtained by reacting the polybutenyl succinimides of the formula (1) or (2) with boron compounds or oxygen-containing organic compounds so as to neutralize or amidate the whole or part of the remaining amino and/or imide groups. Among others, boron-containing polybutenyl succinimides, especially boron-containing bis(polybutenyl)succinimide, are preferably used. The content ratio of nitrogen to boron (B/N) by mass in the boron-containing polybutenyl succinimide compound is usually 0.1 to 3, preferably 0.2 to 1.

The boron compound used for producing the above polybutenyl succinimide derivative can be a boric acid, a borate or a boric acid ester. Specific examples of the boric acid include orthoboric acid, metaboric acid and tetraboric acid. Specific examples of the borate include: ammonium salts, such as ammonium borates, e.g., ammonium metaborate, ammonium tetraborate, ammonium pentaborate and ammonium octaborate. Specific examples of the boric acid ester include: esters of boric acids and alkylalcohols (preferably $C_1$–$C_6$ alkylalcohols), such as monomethyl borate, dimethyl borate, trimethyl borate, monoethyl borate, diethyl borate, triethyl borate, monopropyl borate, dipropyl borate, tripropyl borate, monobutyl borate, dibutyl borate and tributyl borate.

The oxygen-containing organic compound used for producing the above polybutenyl succinimide derivative can be any of $C_1$–$C_{30}$ monocarboxylic acids, such as formic acid, acetic acid, glycolic acid, propionic acid, lactic acid, butyric acid, valeric acid, caproic acid, enanthic acid, caprylic acid, pelargonic acid, capric acid, undecylic acid, lauric acid, tridecanoic acid, myristic acid, pentadecanoic acid, palmitic acid, margaric acid, stearic acid, oleic acid, nonadecanoic acid and eicosanoic acid; $C_2$–$C_{30}$ polycarboxylic acids, such as oxalic acid, phthalic acid, trimellitic acid and pyromellitic acid, and anhydrides and esters thereof; $C_2$–$C_6$ alkylene oxides; and hydroxy(poly)oxyalkylene carbonates.

The amount of the polybutenyl succinimide and/or the derivative thereof added in the lubricant is not particularly restricted, and is preferably 0.1 to 15%, more preferably 1.0 to 12%, based on the total mass of the lubricant. When the amount of the polybutenyl succineimide and/or the derivative thereof in the lubricant is less than 0.1%, there is a possibility of failing to attain a sufficient detergent effect. When the amount of the polybutenyl succineimide and/or the derivative thereof in the lubricant exceeds 15%, the lubricant may deteriorate in demulsification ability. In addition, there is a possibility of failing to obtain a detergent effect commensurate with the amount of the polybutenyl succineimide and/or the derivative thereof added.

Furthermore, the lubricant preferably includes zinc dithiophosphate represented by the following general formula (3) as an antioxidant and as an anti-wear agent

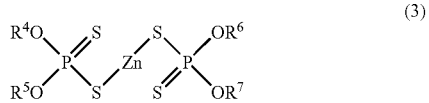

In the general formula (3), $R^4$, $R^5$, $R^6$ and $R^7$ each represent $C_1$–$C_{24}$ hydrocarbon groups. The $C_1$–$C_{24}$ hydrocarbon group is preferably a $C_1$–$C_{24}$ straight-chain or branched-chain alkyl group, a $C_3$–$C_{24}$ straight-chain or branched-chain alkenyl group, a $C_5$–$C_{13}$ cycloalkyl or straight- or branched-chain alkylcycloalkyl group, a $C_6$–$C_{18}$ aryl or straight- or branched-chain alkylaryl group, or a $C_7$–$C_{19}$ arylalkyl group. The above alkyl group or alkenyl group can be primary, secondary or tertiary. Specific examples of $R^4$, $R^5$, $R^6$ and $R^7$ include: alkyl groups, such as methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, heneicosyl, docosyl, tricosyl and tetracosyl; alkenyl groups, such as propenyl, isopropenyl, butenyl, butadienyl, pentenyl, hexenyl, heptenyl, octenyl, nonenyl, decenyl, undecenyl, dodecenyl, tridecenyl, tetradecenyl, pentadecenyl, hexadecenyl, heptadecenyl, octadecenyl (oleyl), nonadecenyl, icosenyl, heneicosenyl, docosenyl, tricosenyl and tetracosenyl; cycloalkyl groups, such as cyclopentyl, cyclohexyl and cycloheptyl; alkylcycloalkyl groups, such as methylcyclopentyl, dimethylcyclopentyl, ethylcyclopentyl, propylcyclopentyl, ethylmethylcyclopentyl, trimethylcyclopentyl, diethylcyclopentyl, ethyldimethylcyclopentyl, propylmethylcyclopentyl, propylethylcyclopentyl, di-propylcyclopentyl, propylethylmethylcyclopentyl, methylcyclohexyl, dimethylcyclohexyl, ethylcyclohexyl, propylcyclohexyl, ethylmethylcyclohexyl, trimethylcyclohexyl, diethylcyclohexyl, ethyldimethylcyclohexyl, propylmethylcyclohexyl, propylethylcyclohexyl, di-propylcyclohexyl, propylethylmethylcyclohexyl, methylcycloheptyl, dimethylcycloheptyl, ethylcycloheptyl, propylcycloheptyl, ethylmethylcycloheptyl, trimethylcycloheptyl, diethylcycloheptyl, ethyldimethylcycloheptyl, propylmethylcycloheptyl, propylethylcycloheptyl, di-propylcycloheptyl and propylethylmethylcycloheptyl; aryl groups, such as phenyl and naphthyl; alkylaryl groups, such as tolyl, xylyl, ethylphenyl, propylphenyl, ethylmethylphenyl, trimethylphenyl, butylphenyl, propylmethylphenyl, diethylphenyl, ethyldimethylphenyl, tetramethylphenyl, pentylphenyl, hexylphenyl, heptylphenyl, octylphenyl, nonylphenyl, decylphenyl, undecylphenyl and dodecylphenyl; and arylalkyl groups, such as benzyl, methylbenzyl, dimethylbenzyl, phenethyl, methylphenethyl and dimethylphenethyl. The above hydrocarbon groups include all possible isomers. Above all, preferred are a $C_1$–$C_{18}$ straight- or branched-chain alkyl group and a $C_6$–$C_{18}$ aryl or straight- or branched-chain alkylaryl group.

The zinc dithiophosphate is exemplified by zinc diisopropyldithiophosphate, zinc diisobutyldithiophosphate, zinc di-sec-butyldithiophosphate, zinc di-sec-pentyldithiophosphate, zinc di-n-hexyldithiophosphate, zinc di-sec-hexyldithiophosphate, zinc di-octyldithiophosphate, zinc di-2-ethylhexyldithiophosphate, zinc di-n-decyldithiophosphate zinc di-n-dodecyldithiophosphate, and zinc diisotridecyldithiophosphate.

The amount of the zinc dithiophosphate added in the lubricant is not particularly restricted. In order to obtain a larger friction reducing effect, the zinc dithiophosphate is preferably contained in an amount of 0.1% or less, more preferably in an amount of 0.06% or less, most preferably in a minimum effective amount, in terms of the phosphorus element based on the total mass of the lubricant. When the amount of the zinc dithiophosphate in the lubricant exceeds 0.1%, there is a possibility of inhibiting the effect of the ashless fatty-ester friction modifier and/or the ashless aliphatic-amine friction modifier.

The production method of the zinc dithiophosphate is not particularly restricted, and the zinc dithiophosphate can be prepared by any known method. For example, the zinc dithiophosphate may be prepared by reacting alcohols or phenols having the above $R^4$, $R^5$, $R^6$ and $R^7$ hydrocarbon groups with phosphorous pentasulfide to form dithiophosphoric acid, and then, neutralizing the thus-formed dithiophosphoric acid with zinc oxide. It is noted that the molecular structure of zinc dithiophosphate differs according to the alcohols or phenols used as a raw material for the zinc dithiophosphate production.

The above-mentioned zinc dithiophosphate compounds can be used alone or in the form of a mixture of two or more thereof. In the case of using two or more of the above zinc dithiophosphate compounds in combination, there is no particular limitation to the mixing ratio of the zinc dithiophosphate compounds.

The lubricant may further include any other additive or additives, such as a metallic detergent, an antioxidant, a viscosity index improver, a friction modifier other than the above-mentioned fatty-ester friction modifier and aliphatic-amine friction modifier, an ashless dispersant other than the above-mentioned polybutenyl succinimide and derivative thereof, an anti-wear agent or extreme-pressure agent, a rust inhibitor, a nonionic surfactant, a demulsifier, a metal deactivator and/or an anti-foaming agent, so as to meet the performance required of the lubricant.

The metallic detergent can be selected from any metallic detergent compound commonly used for engine lubricants. Specific examples of the metallic detergent include sulfonates, phenates and salicylates of alkali metals, such as sodium (Na) and potassium (K), or alkali-earth metals, such as calcium (Ca) and magnesium (Mg); and a mixture of two or more thereof. Among others, sodium and calcium sulfonates, sodium and calcium phenates, and sodium and calcium salicylates are suitably used. The total base number and amount of the metallic detergent can be selected in accordance with the performance required of the lubricant. The total base number of the metallic detergent is usually 0 to 500 mgKOH/g, preferably 150 to 400 mgKOH/g, as measured by perchloric acid method according to ISO 3771. The amount of the metallic detergent is usually 0.1 to 10% based on the total mass of the lubricant.

The antioxidant can be selected from any antioxidant compounds commonly used for engine lubricants. Specific examples of the antioxidant include: phenolic antioxidants, such as 4,4'-methylenebis(2,6-di-tert-butylphenol) and octadecyl-3-(3,5-di-tert-butyl-4-hydroxyphenyl)propionate; amino antioxidants, such as phenyl-α-naphthylamine, alkylphenyl-α-naphthylamine and alkyldiphenylamine; and mixtures of two or more thereof. The amount of the antioxidant is usually 0.01 to 5% based on the total mass of the lubricant.

As the viscosity index improver, there may be used: non-dispersion type polymethacrylate viscosity index improvers, such as copolymers of one or more kinds of methacrylates and hydrogenated products thereof; dispersion type polymethacrylate viscosity index improvers, such as copolymers of methacrylates further including nitrogen compounds; and other viscosity index improvers, such as copolymers of ethylene and α-olefins (e.g. propylene, 1-butene and 1-pentene) and hydrogenated products thereof, polyisobutylenes and hydrogenated products thereof, styrene-diene hydrogenated copolymers, styrene-maleate anhydride copolymers and polyalkylstyrenes. The molecular weight of the viscosity index improver needs to be selected in view of the shear stability. For example, the number-average molecular weight of the viscosity index improver is desirably in a range of 5,000 to 1,000,000, more desirably 100,000 to 800,000, for the dispersion or non-dispersion type polymethacrylates; in a range of 800 to 5,000 for the polyisobutylene or hydrogenated product thereof; and in a range of 800 to 300,000, more desirably 10,000 to 200,000 for the ethylene/α-olefin copolymer or hydrogenated product thereof. The above viscosity index improving compounds can be used alone or in the form of a mixture of two or more thereof. The amount of the viscosity index improver is preferably 0.1 to 40.0% based on the total mass of the lubricant.

The friction modifier other than the above-mentioned fatty-ester friction modifier and aliphatic-amine friction modifier can be any of ashless friction modifiers, such as boric acid esters, higher alcohols and aliphatic ethers, and metallic friction modifiers, such as molybdenum dithiophosphate, molybdenum dithiocarbamate and molybdenum disulfide.

The ashless dispersant other than the above-mentioned polybutenyl succinimide and derivative thereof can be any of polybutenylbenzylamines and polybutenylamines each having polybutenyl groups of which the number-average molecular weight is 900 to 3,500, polybutenyl succinimides having polybutenyl groups of which the number-average molecular weight is less than 900, and derivatives thereof.

As the anti-friction agent or extreme-pressure agent, there may be used: disulfides, sulfurized fats, olefin sulfides, phosphate esters having one to three $C_2$–$C_{20}$ hydrocarbon groups, thiophosphate esters, phosphite esters, thiophosphite esters and amine salts of these esters.

As the rust inhibitor, there may be used: alkylbenzene sulfonates, dinonylnaphthalene sulfonates, esters of alkenyl-succinic acids and esters of polyalcohols.

As the nonionic surfactant and demulsifier, there may be used: noionic polyalkylene glycol surfactants, such as polyoxyethylene alkylethers, polyoxyethylene alkylphenylethers and polyoxyethylene alkylnaphthylethers. The metal deactivator can be exemplified by imidazolines, pyrimidine derivatives, thiazole and benzotriazole.

The anti-foaming agent can be exemplified by silicones, fluorosilicones and fluoroalkylethers.

Each of the friction modifier other than the fatty-ester and aliphatic-amine friction modifiers, the ashless dispersant other than the polybutenyl succinimide and derivative thereof, the anti-wear agent or extreme-pressure agent, the rust inhibitor and the demulsifier is usually contained in an amount of 0.01 to 5% based on the total mass of the lubricant, the metal deactivator is usually contained in an amount of 0.005 to 1% based on the total mass of the lubricant, and the anti-foaming agent is usually contained in an amount of 0.0005 to 1% based on the total mass of the lubricant.

The present invention will be described in more detail by reference to the following examples. However, it should be noted that the following examples are only illustrative and not intended to limit the invention thereto.

EXAMPLE

A piston pin was produced by cutting a cylindrical pin base from a SCr steel material (compliant with JIS G4052), and then, forming a DLC coating on the pin base by arc ion plating. The pin base had a diameter of 18 mm and a length of 22 mm, and the DLC coating had a hydrogen content of 0.5 atomic % or less, a Knoop hardness Hk of 2170 kg/mm², a surface roughness Ry of 0.03 μm and a thickness of 0.5 μm. While lubricated with a lubricant A, the thus-obtained piston pin was then subjected to the following friction/wear test. The chemical composition of the lubricant A is indicated in TABLE 1.

Comparative Example 1

A piston pin was produced in the same manner as in Example 1. Then, the produced piston pin was subjected to the following friction/wear test while lubricated with a lubricant B. The chemical composition of the lubricant B is indicated in TABLE 1.

Comparative Example 2

A piston pin was produced in the same manner as in Example 1, except that no DLC coating was formed on the piston pin. While lubricated with the lubricant B, the piston pin was subjected to the following friction/wear test.

Comparative Example 3

A piston pin was produced in the same manner as in Example 1, except that the DLC coating had a hydrogen content of 2 atomic % or more. While lubricated with the lubricant B, the piston pin was subjected to the following friction/wear test.

Performance Evaluation

The friction/wear test was conducted using a SRV (Schwingungs Reibung und Verschleiss) tester under the following conditions, thereby measuring a friction coefficient and maximum non-seizure load of each of the piston pins of Example and Comparative Examples 1 to 3. The test results are indicated in TABLE 2.

| [Test conditions] | |
|---|---|
| Counterpart: | Disc plate formed of Al alloymaterial: AC8A (compliant with JIS H5202) and having a diameter of 24 mm and a thickness of 7 mm |
| Frequency: | 50 Hz |
| Temperature: | 25° C. |
| Loading mode: | Step loading (The load applied was increased by 130 N/min until the piston pin became seized.) |
| Stroke: | 1 mm |

TABLE 1

| Composition (mass %) | Lubricant A | Lubricant B |
|---|---|---|
| Base oil (PAO) | 87 | 100 |
| Fatty-ester friction modifier (glycerol monolate) | 1.0 | — |
| Aliphatic-amine friction modifier (N,N-dipolyoxyethylene-N-oleylamine) | — | — |
| Ashless dispersant (polybutenyl succinimide) | 5.0 | — |
| Other additives (including an antioxidant and a rust inhibitor) | 7.0 | — |

Note(s):
The amount of each component in the lubricant is indicated with respect to the total mass of the lubricant.

TABLE 2

| | Friction coefficient | Maximum non-seizure load (N) |
|---|---|---|
| Example | 0.07 | 1850 |
| Comparative Example 1 | 0.1 | 1100 |
| Comparative Example 2 | 0.19 | 610 |
| Comparative Example 3 | 0.14 | 920 |

As is apparent from TABLE 2, the piston pin of Example had a much lower friction coefficient and a much larger maximum non-seizure load than those of Comparative Examples 1, 2 and 3. It can be thus concluded that the piston pin of Example had superior low-friction characteristics and higher seizure resistance.

As described above, it is possible to provide a hard-carbon coated piston pin highly resistant to seizing to obtain a larger friction reducing effect in combination with a specific lubricant according to the present invention.

The entire contents of Japanese Patent Application No. 2003-162759 (filed on Jun. 6, 2003) are herein incorporated by reference.

Nissan Motor Co., Ltd. and Nippon Oil Corporation are parties to a joint research agreement.

Although the present invention has been described with reference to a specific embodiment of the invention, the invention is not limited to the above-described embodiment. Various modifications and variations of the embodiment described above will occur to those skilled in the art in light of the above teaching. The scope of the invention is defined with reference to the following claims.

What is claimed is:

1. An engine piston-pin sliding structure, comprising:
a piston pin slidably engaged into a pin boss of an engine piston, the piston pin having a pin base and a hard carbon coating formed by physical vapor deposition on the pin base so as to define a sliding surface slidable over a bearing surface of the pin boss, the hard carbon coating containing 25 atomic % or less of hydrogen; and
a lubricant interposed between the sliding surface of the piston pin and the bearing surface of the pin boss, the lubricant containing at least one of an ashless fatty-ester friction modifier and an ashless aliphatic-amine friction modifier.

2. An engine piston-pin sliding structure according to claim 1, wherein the hard carbon coating contains 5 atomic % or less of hydrogen.

3. An engine piston-pin sliding structure according to claim 2, wherein the hard carbon coating contains 0.5 atomic % or less of hydrogen.

4. An engine piston-pin sliding structure according to claim 1, wherein said at least one of the ashless fatty-ester friction modifier and the ashless aliphatic-amine friction modifier has a $C_6$–$C_{30}$ hydrocarbon group and is contained in an amount of 0.05 to 3.0% by mass based on the total mass of the lubricant.

5. An engine piston-pin sliding structure according to claim 1, wherein the lubricant further contains polybutenyl succinimide and/or a derivative thereof.

6. An engine piston-pin sliding structure according to claim 5, wherein the polybutenyl succinimide and/or the derivative thereof is contained in an amount of 0.1 to 15% based on the total mass of the lubricant.

7. An engine piston-pin sliding structure according to claim 1, wherein the lubricant further contains 0.1% or less of zinc dithiophosphate in terms of phosphorus based on the total mass of the lubricant.

8. An engine piston-pin sliding structure according to claim 1, wherein the hard carbon coating is a diamond-like carbon coating formed by arc ion plating.

9. An engine piston-pin sliding structure according to claim 1, wherein the pin base has a surface roughness Ra of 0.03 µm or lower.

10. A piston pin to be slidably engaged into a pin boss of an engine piston with a lubricant interposed between the piston pin and pin boss, the lubricant containing at least one of an ashless fatty-acid friction modifier and an ashless aliphatic-amine friction modifier, the piston pin comprising:
a pin base; and
a hard carbon coating formed by physical vapor deposition on the pin base so as to define a sliding surface slidable over a bearing surface of the pin boss via the lubricant, the hard carbon coating having 25 atomic % or less of hydrogen.

11. A piston pin according to claim 10, wherein the hard carbon coating has 5 atomic % or less of hydrogen.

12. A piston pin according to claim 11, wherein the hard carbon coating has 0.5 atomic % or less of hydrogen.

13. A piston pin according to claim 10, wherein the hard carbon coating is a diamond-like carbon coating formed by arc ion plating.

14. A piston pin according to claim 10, wherein the pin base has a surface roughness Ra of 0.03 µm or lower.

* * * * *